United States Patent [19]

Gladstein

[11] 4,151,603

[45] Apr. 24, 1979

[54] PRECHARGED FET ROS ARRAY

[75] Inventor: Leo A. Gladstein, Reston, Va.

[73] Assignee: International Business Machines Corporation, Armonk, N.Y.

[21] Appl. No.: 847,353

[22] Filed: Oct. 31, 1977

[51] Int. Cl.² .................... G11C 17/00; G11C 7/00
[52] U.S. Cl. ................................. 365/104; 365/203
[58] Field of Search ............... 365/104, 184, 182, 203

[56] References Cited

U.S. PATENT DOCUMENTS

| 3,866,186 | 2/1975 | Suzuki | 365/104 |
| 4,074,238 | 2/1978 | Masuda | 365/104 |

FOREIGN PATENT DOCUMENTS 1456114  11/1976  United Kingdom ............. 365/184

OTHER PUBLICATIONS

Gurski, Field Effect Transistor Read-Only Storage Unit, IBM Technical Disclosure Bulletin, vol. 7, No. 11, 4/65, pp. 1107–1108.

Primary Examiner—Stuart N. Hecker
Attorney, Agent, or Firm—John E. Hoel

[57] ABSTRACT

The problem of a race condition in the precharged drain type FET read only storage circuits is avoided in the invention disclosed herein, by applying the bit decode signal to the source of the array device, so that the drain cannot be discharged through the FET array device unless both the bit line connected to the source and word line connected to the gate have on-signals. Thus, the memory circuit can be operated in a faster cycle because the word and bit signals may be made coincident.

4 Claims, 2 Drawing Figures

PRECHARGED FET ROS ARRAY

FIELD OF THE INVENTION

The invention disclosed broadly relates to memory circuits and more particularly relates to FET read only storage circuits.

BACKGROND OF THE INVENTION

FET read only storage circuits of the type which precharges the array drain line which serves as the sense node and then which conditionally discharges the array drain line through an FET array device which is selected by pulsing its gate with the word line, have an increased speed of operation since the FET threshold level for the array devices makes it easier to discharge a preexisting charge through them than to initiate a charge through them. But read only storage circuits of this type in the prior art have the defect that they are subject to race conditions between the word line signal and the bit line signal when their occurrence is designed to be approximately coincident so as to increase speed.

For example, W. Cordaro "Read Only Storage Bit Precharge/Sense Circuit" IBM TDB, Vol. 17, No. 4, September 1974, page 1044 shows a read only storage memory circuit of the precharged sense node type. Cordaro shows the bit line connected to the drain which is charged to $V_H$ and then conditionally discharged by the FET array device. The word line connected to the gate of the FET array device must go on before the read enable signal to avoid prematurely discharging the drain line through the read enable FET and thus having an invalid signal condition at the output node. The Cordaro circuit suffers from a race condition between the bit line signal and the word line signal whenever the design is speeded up by making their occurrence approximately coincident.

OBJECTS OF THE INVENTION

It is therefor an object of the invention to eliminate the race condition from bit line and word line signals in an FET ROS.

It is another object of the invention to increase the speed of an FET ROS in an improved manner.

It is yet another object of the invention to increase the signal voltage swing on the output of an FET ROS in an improved manner.

SUMMARY OF THE INVENTION

These and other objects, features and advantages of the invention are accomplished by the improved FET ROS circuit disclosed herein.

The problem of the race condition between the word line signal and the bit line signal in a precharged drain type read only storage is avoided by applying the bit decode signal to the source of the array device, so that the common drain cannot be discharged until both the bit line and the word line voltages are up. The memory can be operated faster because the word and bit line signals may be made coincident. In addition, the use of the depletion mode FET array devices increases the voltage swing for the signals sensed by the sense amplifier. The current source for the circuit may be pulse powered so that power dissipation may be reduced.

DESCRIPTION OF THE FIGURES

These and other objects, features and advantages of the invention can be more fully appreciated with reference to the accompanying figures.

DISCUSSION OF THE PREFERRED EMBODIMENT

FET read only storage circuits of the type which precharges the array drain line which serves as the sense node and then which conditionally discharges the array drain line through an FET array device which is selected by pulsing its gate with the word line, have an increased speed of operation since the FET threshold level for the array devices makes it easier to discharge a preexisting charge through them than to initiate a charge through them. But read only storage circuits of this type have the defect that they are subject to race conditions between the word line signal and the bit line signal when their occurrence is designed to be approximately coincident so as to increase speed.

The problem of a race condition in the precharged drain type read only storage circuits is avoided in the present invention by applying the bit decode signal to the source of the array device, so that the drain cannot be discharged through the FET array device unless both the bit line connected to the source and word line connected to the gate are up. Thus, the memory circuit can be operated in a faster cycle because the word and bit signals may be made coincident.

Because the circuit disclosed avoids the race condition in prior art precharged sense node type read only storage circuits, the memory can be operated faster so that the word and bit line signals may be made coincident. In addition, the use of depletion mode FET array devices increases the voltage swing for the signals sensed by the sense amplifier. The current source for the circuit may be pulse powered so that power dissipation may be reduced.

Figure 1:
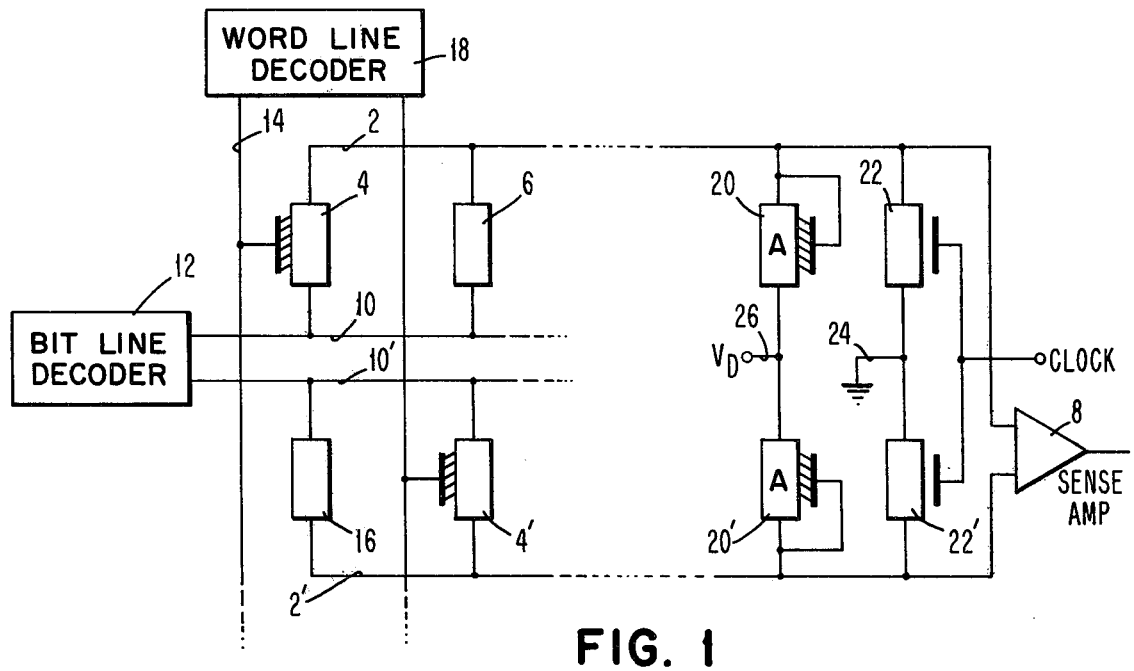
FIG. 1 shows a schematic circuit diagram of the depletion device ROS array.

In the circuit schematic shown in FIG. 1, the improved read only storage memory circuit is of the precharged sense node type. The circuit has been designed to avoid the prior art problem of race conditions between the bit line and word line signals.

The array drain line 2 is common to the drains of a plurality of FET array devices 4 and 6, and is connected as the sense node to the sense amplifier 8. An array source line 10 is common to the sources of the plurality of FET array devices 4 and 6, and is connected to a bit line address decoder 12. The FET array devices 4 and 6, etc. form one of a plurality of rows of similar FET devices in the array.

The rows of FET array devices have the individual devices 4 and 6 therein arranged into columns of devices 4 and 16, for example, and a word line 14 connects to selected ones of the gates for the devices in a column. The word line 14 connects to the gate of the FET array device 4 when that device 4 represents the first binary value to be stored in the read only storage. The word line 14 is selectively not connected to the gate of another array device 16 of the plurality of FET array devices when that other device 16 represents the second binary value to be stored in the read only storage. The word line 14 is connected to a word line decoder 18. Similarly, the gate of array device 4' is connected to its word line but the gate of array device 6 is selectively not connected thereto.

Figure 2:
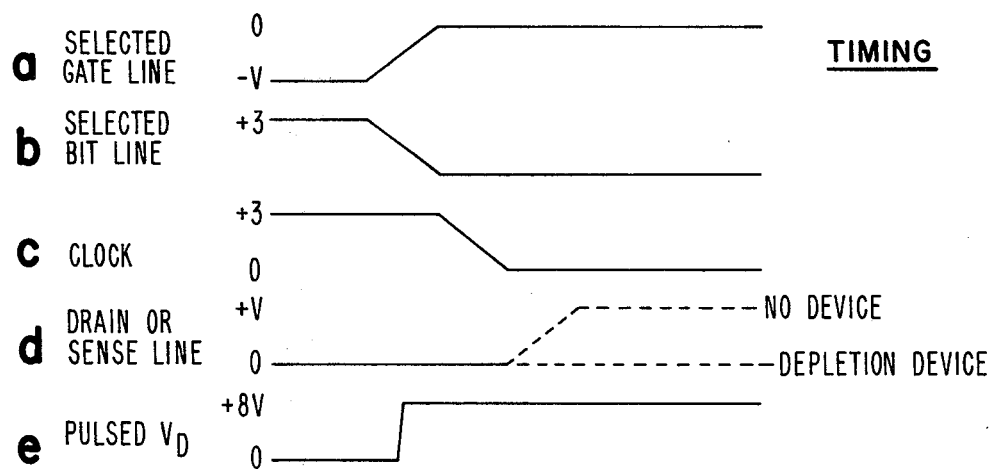
FIG. 2 shows five voltage versus time waveform diagrams labeled a through e, for various nodes in the circuit shown in FIG. 1.

The FET array device 4 having its gate connected to the word line 14, will remain nonconductive if only the bit line 10 is pulsed on, as is shown in the waveform diagram b of FIG. 2, or alternatively, if only the word line 14 is pulsed on as is shown in the waveform diagram a of FIG. 2, in a half-select mode. The FET array device 4 will become conductive when both the bit line 10 and the word line 14 have pulsed signals, as is shown in the waveform diagrams b and a, respectively, in FIG. 2 so that the FET device 4 is fully selected.

The current source, shown in FIG. 1 as the self-biased depletion mode FET device 20, has its drain connected to a drain supply voltage $V_D$ at the terminal 26 and its source connected to the array drain line 2. The current source 20 charges the array drain line 2 through the FET array device 4 after the bit line decoder 12 and the word line decoder 18 have issued signals for a full select of the FET device 4, turning it on. When this occurs, the voltage of the array drain line 2, which is shown in the waveform diagram d of FIG. 2, will have a relatively slow rise time compared to the rise time which would occur if there were no gate electrode for the array device 4. This change in the voltage for the array drain line 2 will be detected by the sense amplifier 8 which can distinguish between the rise times of the voltage for the array drain line 2 depending on whether there is conduction or no conduction through the FET array device 4.

Two alternative embodiments can be employed for the current source 20. The first embodiment is the use of a pulse waveform for $V_D$ as is shown in the waveform diagram e of FIG. 2 which transitions from zero to 8 volts just prior to the selection by the bit decoder 12 and word line decoder 18 of the FET device 4 in the array. In this embodiment less power will be dissipated than will be the case if $V_D$ were at a DC potential.

The second embodiment for the current source 20 is the use of a DC potential connected to the node 26 at approximately 8 volts, and the inclusion of a clocked FET device 22, connected between the array drain line 2 and the ground terminal 24. In this alternate embodiment, the clock is turned on in accordance with the waveform diagram c of FIG. 2 during the time that selection is taking place by the bit line decoder 12 and word line decoder 18, connecting the drain line 2 to ground potential. After the selection of the FET device in the array has taken place, the clock waveform transistions from plus 3 volts to ground potential, thereby removing the FET device 22 as a current path to ground for the current source 20 so that the voltage of the array drain 2 will rise at a rate which is a function of whether or not the FET device 4 is conducting. This rate of change in the potential of the drain line 2 is sensed by the sense amp 8 as was discussed above.

One advantage of this circuit is that the drain line 2 need not be charged or discharged from a previously charged condition through a minimum size array device since the drain line 2 is charged during the sensing interval through the current source 20 and it is the rate of change of the voltage on a drain line 2, as it increases, which is sensed by the sense amplifier 8. The charging of the large impedance drain line 2 is done through the current source 20 which can be made considerably larger than the array device 4. The resulting circuit can therefor be operated at a faster rate while at the same time accommodate smaller size array devices than was possible in the prior art.

In an alternate embodiment of the invention, the FET array devices 4 may be of the depletion mode type to eliminate the threshold voltage potential difference between the array drain line 2 and the array source line 10 when the FET array device 4 is conductive.

While the invention has been particularly shown and described with reference to the preferred embodiment thereof, it will be understood by those skilled in the art that the foregoing and other changes in form and detail may be made therein without departing from the spirit and scope of the invention.

I claim:

1. An improved read only storage memory circuit of the precharged sense node type, which avoids the problem of race conditions between the bit line and word line signals, comprising:
   an array drain line common to the drains of a plurality of FET array devices, connected as the sense node to a sense amplifier;
   an array source line common to the sources of said plurality of FET array devices, connected to a bit line signal source;
   a word line connected to the gate of one of said plurality of FET array devices when that one device represents a first binary value to be stored and which is not connected to the gate of another one of said plurality of FET array devices when that other one device represents a second binary value to be stored, connected to a word line signal source;
   said one FET array device remaining nonconductive if only said bit line or if only said word line has an on signal, said one FET array device becoming conductive when both said bit line and said word line have on signals; a current source connected to said array drain line, for charging said array drain line afer said bit line signal source and word line signal source have issued valid signals;
   whereby the voltage of said array drain line will be detected by the sense amplifier to not increase as rapidly when said one FET array device is conductive than when said other FET array device is nonconductive.

2. The circuit of claim 1, wherein said current source is pulse powered.

3. The circuit of claim 1, wherein said current source is a DC current source in parallel with a clocked FET connected between said array drain line and ground.

4. The circuit of claim 1, wherein said FET array devices are of the depletion mode type for eliminating the threshold voltage potential difference between said array drain line and said array source line when said FET array devices are conductive.

* * * * *